United States Patent [19]

Omino

[11] Patent Number: 5,167,759
[45] Date of Patent: Dec. 1, 1992

[54] PRODUCTION PROCESS OF SINGLE CRYSTALS

[75] Inventor: Akira Omino, Sendai, Japan

[73] Assignee: Mitsui Mining Company, Limited, Tokyo, Japan

[21] Appl. No.: 555,498

[22] PCT Filed: Dec. 13, 1989

[86] PCT No.: PCT/JP89/01248

§ 371 Date: Aug. 10, 1990

§ 102(e) Date: Aug. 10, 1990

[87] PCT Pub. No.: WO90/07021

PCT Pub. Date: Jun. 28, 1990

[30] Foreign Application Priority Data

Dec. 14, 1988 [JP] Japan ................. 63-313795

[51] Int. Cl.$^5$ .................................................. C30B 7/00
[52] U.S. Cl. ......................... 156/624; 156/616.1; 156/616.4; 156/616.41; 156/623 R; 156/623 Q; 156/DIG. 83; 422/248
[58] Field of Search ............... 156/624, 616.1, 616.4, 156/616.41, 623 R, 623 Q, DIG. 83; 422/248

[56] References Cited

U.S. PATENT DOCUMENTS

| | | | |
|---|---|---|---|
| 1,986,196 | 1/1935 | Grosse | 422/241 |
| 2,547,521 | 4/1951 | Buehler et al. | 156/623 Q |
| 3,033,659 | 5/1962 | Fischer | 422/248 |
| 4,083,748 | 4/1978 | Gault | 156/616.41 |
| 4,335,074 | 6/1982 | Bernas | 422/241 |
| 4,521,272 | 6/1985 | Gault | 156/616.41 |
| 4,529,027 | 7/1985 | Brice et al. | 156/616.41 |
| 4,612,082 | 9/1986 | Westphal et al. | 156/607 |

FOREIGN PATENT DOCUMENTS

| | | |
|---|---|---|
| 0321576 | 6/1989 | European Pat. Off. |
| 51-30914 | 8/1976 | Japan. |
| 59-193870 | 12/1984 | Japan. |
| 63-225595 | 9/1988 | Japan. |
| 63-310786 | 12/1988 | Japan. |
| 1262289 | 5/1989 | Japan .................. 156/616.4 |
| 0923241 | 4/1963 | United Kingdom .......... 156/616.41 |

OTHER PUBLICATIONS

"Growing Quartz Crystals;" A. C. Walker; *Electronics*, pp. 96-99.
"Growing Single Crystals of High Melting, Decomposable Compounds", Blum et al; *IBM Technical Disclosure Bulletin*; pp. 1674-1676 vol. 9 No. 12 May 1967.
Patent Abstracts of Japan, vol. 8, No. 93, Apr. 27, 1984 & JP-A-59-8690.
Patent Abstracts of Japan, vol. 13, No. 21, Jan. 18, 1989 and JP-A-225595.
Fischer, "Techniques for Melt-Growth of Luminescent Semiconductor Crystals under Pressure," pp. 41c-47c, J. of Electrochemical Soc. (Feb. 1970).

*Primary Examiner*—Olik Chaudhuri
*Assistant Examiner*—Felisa Garrett
*Attorney, Agent, or Firm*—Millen, White, Zelano and Branigan

[57] ABSTRACT

A single crystal is produced from the melt of a starting material by solidification. The process makes use of a triple-walled crucible compound of an outer cylinder made of a material selected from high-melting-point metals and alloys having a melting point of at least 1,500° C., an inner cylinder made of at least one material selected from high-melting-point ceramic materials and carbon materials such as graphite, pyrolytic graphite and vitreous carbon and an intermediate cylinder made of quartz glass. The starting material is charged in the inner cylinder. The inner cylinder with the starting material charged therein is inserted in the intermediate cylinder. The intermediate cylinder with the inner cylinder hermetically inserted therein is inserted in the outer cylinder. The outer cylinder is welded to hermetically enclose the intermediate and inner cylinders therein. The thus-assembled crucible is heated to fuse the starting material, followed by crystal growth.

9 Claims, 3 Drawing Sheets

PRODUCTION PROCESS OF SINGLE CRYSTALS

DESCRIPTION

1. Technical Field

The present invention relates to a process for producing a single crystal from a melt by solidification and crystal growth.

2. Background Art

In view of the recent development of the electronic industry and the like, crystal growing technology has become an extremely important industrial consideration. As materials for new functional devices, compound materials such as GaAs, CdS and ZnSe have now been increasingly recognized to be important in addition to single elemental materials such as Si and Ge. For the production of single crystals from these materials, there is a process in which these single crystals are produced from their corresponding melts by solidification. This process permits formation of large crystals rather easily, so that it is widely used for the growth of single crystals.

The above process is however accompanied by the drawbacks that when the vapor pressure of the melt of a compound is high, an undesirable high amount of the compound evaporates from the crucible and easy formation of a crystal is prevented and when one component of a compound has a higher evaporate rate, the composition of a melt deviates from the stoichiometric composition to result not only in a failure in performing the growth of a crystal as desired but also in the formation of a crystal of reduced quality.

To avoid these problems, quartz ampoules are generally used. Softening of a quartz ampoule however begins at about 1,200° C., beyond which the quartz ampoule may be deformed or may lose transparency and, in the worst case, may explode. Application of the process in which a quartz ampoule is employed is therefore limited to compounds whose melting points are as low as 1,400° C. even at peak temperature.

In the case of a high-melting-point compound having a melting point of 1,400° C. or higher, it has heretofore been the practice that the compound is charged in a crucible of graphite or the like, the crucible is placed in a high-pressure vessel, the vessel is pressurized with an inert gas such as argon, and a crystal is then allowed to grow while the compound is prevented from evaporation, in other words, the high-pressure fusing technique has been conducted to date.

Although the crucible is enclosed within the high-pressure vessel in the above technique, the crucible itself is not closed hermetically and the high-pressure vessel has a large empty space even after the insertion of the crucible therein. Therefore, it is practically impossible to avoid evaporation of a melt and/or deviation from the stoichiometric composition. The above technique is also accompanied by the drawbacks that materials of the high-pressure vessel and heater are corroded and the resulting crystal is contaminated by these materials. In the case of a compound whose melting point is at least 1,400° C., one may consider charging a starting material in a crucible of a high-melting-point metal and after fusion and hermetic enclosure, heating the crucible to conduct growth of a crystal. This process is however accompanied by the drawbacks that the resulting crystal cannot be easily taken from the crucible in many instances, the metal of the crucible may be corroded at portions brought into contact with the melt and the resulting crystal may be contaminated with the metal of the crucible. This process is therefore unsuited for actual practice.

As a method for overcoming these drawbacks, the present inventors found to use a double-walled crucible composed, as shown in FIG. 2, of an outer cylinder 1 made of a material selected from high-melting-point metals and alloys and an inner cylinder 4 made of at least one material selected from high-melting-point metals and alloys, high-melting-point ceramic materials and carbon materials such as graphite. Based on the finding, a patent application has already been filed (Japanese Patent Laid-Open No. 310786/1988). The process which uses the double-walled crucible has the following merits.

(1) A substance having a high melting point and a high vapor pressure can be crystallized while it is completely and hermetically enclosed within a vessel.

(2) The expensive crucible can be used repeatedly and, moreover, crystal growth is feasible using a relatively inexpensive and general furnace such as a vacuum furnace or an inert gas furnace, so that the process is extremely advantageous from the economic viewpoint. The process is therefore industrially advantageous.

However, the high-melting-point metal or alloy used in the outer cylinder is as a purity as low as 99.9% and contains small amounts of impurities. At high temperatures, these impurities and the metal itself may be vaporized, leading potentially to the inclusion of extremely small amounts of impurities in the crystal. The process in which the above-described double-walled crucible is used is therefore still insufficient for the production of crystals of the semiconductor level quality, which require exceptional purity.

DISCLOSURE OF THE INVENTION

An object of this invention is to provide a process which is free of such problems and can advantageously produce single crystals of an extremely high purity on an industrial scale.

In one aspect of this invention, there is thus provided a process for producing a single crystal from a melt of a starting material by solidification, for example, in accordance with the vertical Bridgman technique or the vertical gradient freeze technique, which comprises:

providing a triple-walled crucible composed of an outer cylinder made of a material selected from high-melting-point metals and alloys having a melting point of at least 1,500° C., an inner cylinder made of at least one material selected from high-melting-point ceramic materials and carbon materials such as graphite, pyrolytic graphite and vitreous carbon and an intermediate cylinder made of quartz glass;

charging the starting material in the inner cylinder;

inserting hermetically the inner cylinder, with the starting material charged therein, in the intermediate cylinder;

inserting the intermediate cylinder, with the inner cylinder hermetically inserted therein, in the outer cylinder;

welding the outer cylinder to hermetically enclose the intermediate and inner cylinders therein;

heating the thus-assembled crucible to fuse the starting material, followed by crystal growth.

Figure 1:
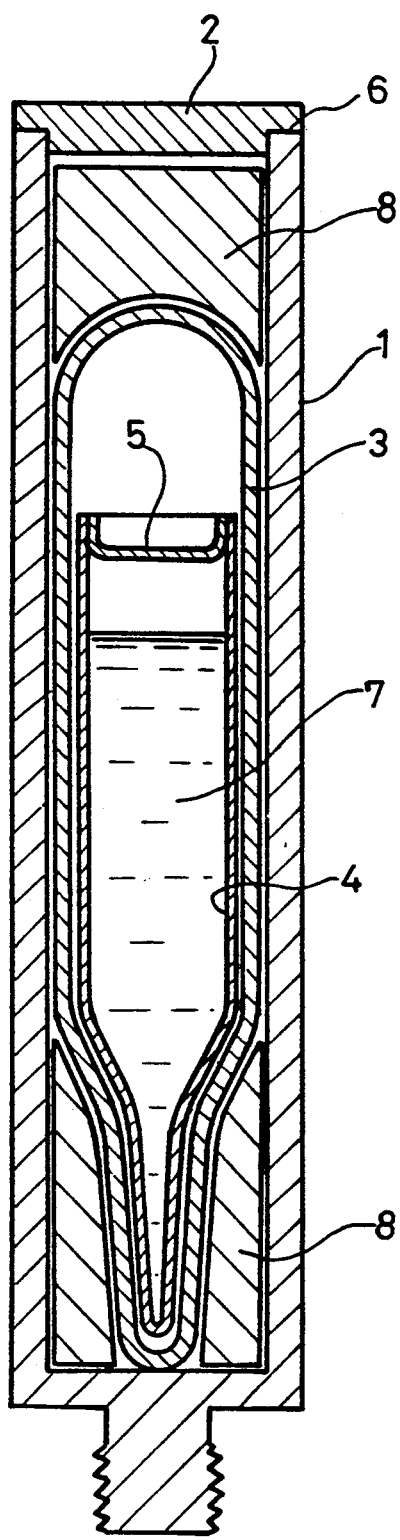
FIG. 1 is a longitudinal cross-section showing one example of the structure of the triple-walled crucible useful in the present invention.

1 Outer cylinder
2 Outer lid
3 Intermediate cylinder
4 Inner cylinder
5 Inner lid
6 Welded parts
7 Starting material
8 Spacer
9 ZnSe seed crystal
10 Zinc
11 PBN-made holder
12 Packing material
a Position of the seed crystal

BEST MODE FOR CARRYING OUT THE INVENTION

The production process of the invention uses a triple-walled crucible composed of a lidded outer cylinder, a lidded inner cylinder, and an intermediate cylinder which can hermetically enclose the inner cylinder and can be inserted in the outer cylinder. The material of the outer cylinder is selected from metals and alloys which have a melting point of at least 1,500° C. and excellent corrosion resistance. Typical materials include metals such as W, Ta, Os, Mo, Ir, Ru, Rh and Pt as well as alloys containing these metals as base materials. Among them, Mo, W and Ta are particularly preferred for economic reasons.

The outer cylinder is in the form of a tube sealed at one end. A lid made of the same material covers an open end of the outer cylinder, so that the outer cylinder and the lid can be welded together in use to hermetically enclose the intermediate and inner cylinders. Although there is no particular limitation on the transverse cross-section thereof, a concentric cross-sectional shape is desired in view of even transfer of heat.

Since the inner cylinder is not required to be as strong as the outer cylinder, a material of relatively low strength can be used and its wall thickness can be smaller. However, its material must be a high-purity substance that has a melting point higher than the crystal to be produced and does not react with a starting material for the crystal.

The material which makes up the inner cylinder can be selected from carbon materials such as graphite, pyrolytic graphite and vitreous carbon or high-melting-point ceramic materials such as alumina, BN, AlN, BeO, $CaF_2$, MgO, SiC, $CeO_2$, $ThO_2$, $ZrO_2$ and $ZrSiO_4$. It is preferred to make the inner lid of the same material as the inner cylinder. Among these materials, graphite and BN are especially preferred because they are hardly wetted with a melt of a starting material for a crystal and the solidified crystal can be easily taken out. In the case of ceramic materials, those produced by a process which does not require the use of a sintering aid such as the CVD process, like pyrolytic BN(PBN) are preferred. The interior of the inner cylinder can be formed into any desired configuration in accordance with the shape of the crystal to be produced. To facilitate the removal of the crystal, it is however convenient to have a tapered structure such that the interior of the inner cylinder becomes narrower toward the bottom.

Further, formation of an end portion of the inner cylinder into a small-diameter tubular shape as shown in FIG. 1 permits accurate temperature control of an initial crystal depositing portion, whereby the growth of the crystal is rendered smoother. With such an inner cylinder, it is difficult to separate an end portion of the resultant crystal. The crystal therefore tends to break and to remain in the small-diameter tubular portion. No problem will however arise even when the next operation is conducted with the crystal still left over in the small-diameter tubular portion. To the contrary, some advantageous effects can be expected such that uniform charging of the starting material is facilitated, the crystal growing direction is stabilized and a crystal of better quality can be obtained.

Figure 3:
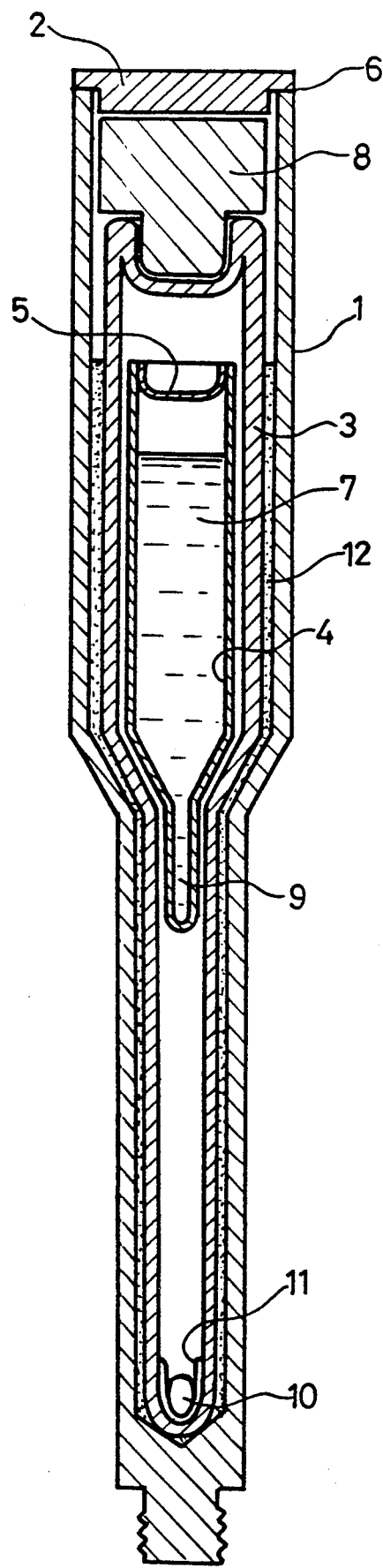
FIG. 3 is a longitudinal cross-section depicting another example of the structure of the triple-walled crucible useful in the present invention.

The intermediate cylinder is not required to be as strong as the outer cylinder, either. It is however necessary to use a material which allows easy enclosing work and does not give off contaminants even at high temperatures. The intermediate cylinder is made of quartz glass, especially high-purity quartz glass. Quartz begins to soften at 1,200° C. and its strength drops at 1,400°–1,600° C. When employed as a crystal growing vessel, there is a potential danger that the vessel may be exploded by internal pressure due to the vapor pressure of the melt when the temperature exceeds 1,200° C. Since the intermediate cylinder is externally supported by the outer cylinder in the process of the invention, the intermediate cylinder can withstand the internal pressure and can retain the hermetic condition up to about 1,800° C. No particular limitation is imposed on the shape of the intermediate cylinder, as long as it permits smooth insertion of the inner tube thereinto and also hermetic enclosure. It is usually desirable to form the intermediate cylinder into shape conforming to the outer shape of the inner cylinder so as to minimize the internal space into which the starting material in the inner cylinder may be allowed to evaporate. For the insertion of the intermediate cylinder into the outer cylinder, the interior shape of the outer cylinder may be formed into conformity with the outer shape of the intermediate cylinder. To facilitate its repeated use, handling and the like, it is desirable to form the outer cylinder as a simple cylinder, to use an internal spacer of suitable shape in accordance with the shape of the intermediate cylinder and to employ the crucible in a stabilized state. Further, by providing a space in an end portion of the intermediate cylinder and placing one of the constituent elements of a starting compound there as shown in FIG. 3, it is possible to adjust the vapor pressure, whereby small amounts of components, which have leaked out around the lid of the inner cylinder, are prevented from being deposited on the lower-temperature areas in the intermediate cylinder, to avoid minute variations of the composition of the crystal.

Existence of an unduly large gap between the outer cylinder and the intermediate cylinder has the potential danger that the intermediate cylinder of quartz glass may expand and explode during heating. Direct contact of the intermediate quartz glass cylinder with the outer metal cylinder may result, when employed at high temperatures, in melt-adhesion of both the cylinders or loss of transparency of the intermediate quartz glass cylinder at points of contact with the outer metal cylinder and, in the worse case, in complete breakdown of the hermetic enclosure by the intermediate quartz glass cylinder. These inconvenience can however be successfully avoided when the intermediate cylinder and the outer cylinder are disposed at a suitable interval and a powder such as BN is filled as a parting agent and also as a packing material within the spacing therebetween. Packing of a powder of the same composition as the material of the melt as a packing material has the advantage that the vapor pressure becomes equal in both the inside of and the outside of the intermediate cylinder when the crucible is heated, thereby making the crucible resistant to deformations. Another advantage can also be realized in that the resulting crucible can be used to hermetically enclose starting materials for crystals, the vapor pressures of said starting materials being so high that the process using a conventional quartz ampoule cannot be applied to them.

The process of the present invention for the production of a crystal will now be described in detail based on one example in which the exemplary crucible of FIG. 1 is used. Suitable materials can be selected from the above-described materials to make an outer cylinder 1, inner cylinder 4 and intermediate cylinder 3. It is however most preferred to use Mo, graphite or BN and quartz glass in combination as the materials of the outer, inner and intermediate cylinders, respectively.

It is desired to thoroughly clean the inner and intermediate cylinders in advance, for example, by washing and/or baking.

Firstly, a starting material 7 for a crystal is charged in the inner cylinder 4. It is desirable to use the starting material 7 in a state increased in bulk density by pressing or sintering, although it may be used as is, namely, in the powdery form. After the inner cylinder 4 is closed by an inner lid 5 made of the same material as the inner cylinder 4, the inner cylinder 4 is inserted in the intermediate cylinder 3 made of quartz glass and then enclosed in a vacuum within the intermediate cylinder 3. Next, the intermediate cylinder 3 is inserted in the outer cylinder 1, if necessary together with a spacer 8 and/or a packing material (not shown). An outer lid 2 made of the same material as the outer cylinder 1 is fitted over an opening of the outer cylinder 1 and the outer cylinder 1 and the outer lid 2 are hermetically welded together in a vacuum. For the vacuum enclosure of the intermediate cylinder 3 within the outer cylinder 1, the crucible may be placed in a vacuum apparatus and while preventing fusion of the intermediate quartz glass cylinder 3, for example, by cooling the crucible by a water-cooled cooling block at all the portions other than an upper end portion, the outer lid 2 and the upper end portion of the outer cylinder 1 may be welded together by electron beams, laser beams or the like. Welded parts are indicated at numeral 6 in the figure. If necessary, the outer cylinder 6 may be sealed with an inert gas filled therein.

The starting material 7 hermetically enclosed within the outer metal cylinder 1 is then processed by the vertical Bridgman technique or the vertical gradient freeze technique, both known to date, in an inert gas furnace or a vacuum furnace, whereby the starting material is converted into a melt, followed by crystallization. By placing a seed crystal at the lower end of the inner cylinder 1 as viewed in FIG. 1 and controlling the temperature gradient in such a way that a temperature equivalent to the melting point of the crystal crosses the seed crystal, it is possible to control the orientation of growth of the crystal and, at the same time, to avoid over-cooling of the melt. As a result, the crystal can be obtained without inclusions. After the crystal growing operation, the crucible is cooled and an upper end portion of the outer cylinder 1 is cut off to take out the intermediate cylinder 3. An upper end portion of the intermediate cylinder 3 is then cut off to take out the inner cylinder 4. The outer cylinder 1 can be used repeatedly provided that the outer cylinder 1 is formed with a sufficiently long upper portion. If the outer cylinder 1 becomes short as a result of repetition of reuse, a fresh cylinder may be welded to the thus-shortened outer cylinder 1.

The process of the invention can easily produce single crystals of exceptional purity owing to the use of the triple-walled crucible which uses in combination a carbon or ceramic material having properties such as production of no contaminant, strong corrosion resistance and easy release of resulting crystals—such as graphite, pyrolytic graphite or vitreous carbon, or BN—as the inner cylinder; a high-melting-point metal having high strength and easy hermetic weldability a the outer cylinder; and quartz glass having easy hermetic sealability as the intermediate cylinder.

The process of the invention can be applied for the growth of single crystals of various starting materials which permit the growth of crystals from their melts. In particular, it allows a crystal of a compound having high melting point and vapor pressure to grow without modifications to the stoichiometric proportions of its constituent elements. The process of the invention is therefore suitable for the growth of crystals of ZnS, ZnSe, ZnTe, CdS, CdSe, GaP, GaAs, CdTe, HgS, PbSe, InP and the like. Upon production of a single crystal, it may be required in some instances to provide a single crystal with one or some of its components contained in excess with a view toward improving characteristics such as electric conductivity. In such a case, the use of a vessel made of a relatively reactive material such as Mo faces difficulties in obtaining a single crystal of a desired composition even when the vessel makes up a similar closed system, because the component or components employed in excess amounts tend to react with such a material. Since the growth of a crystal is performed in a completely sealed system made of quartz glass in the present invention, the process of the invention has the advantage that the ratio of the numbers of the individual atoms in a crystal can be controlled precisely.

The process of the invention will hereinafter be described more specifically in the following examples.

EXAMPLE 1

Growth of a single crystals of ZnSe (melting point: 1,520° C.) was conducted using a crucible of the structure shown in FIG. 1. In the crucible, the outer, intermediate and inner cylinders were made of molybdenum, high-purity quartz glass, pyrolytic boron nitride (product of Shin-Etsu Chemical Co., Ltd.; hereinafter abbreviated as "PBN"), respectively. After the inner PBN cylinder was immersed for 3 hours in aqua regia and then thoroughly washed with purified water, it was baked at 1,000° C. for about 1 hour in a vacuum furnace. The intermediate quartz glass cylinder was immersed for 10 minutes in about 10% hydrofluoric acid and then thoroughly washed with purified water. It was thereafter baked at 1,000° C. for about 1 hour in a vacuum furnace. On the other hand, the outer molybdenum cylinder and the spacer and outer lid, which were also made of molybdenum, were baked for about 1 hour in a vacuum furnace at 1,500° C. ZnSe powder was filled in the narrow-diameter tubular portion at the end portion of the inner cylinder. The cylindrical portion of the inner cylinder was filled with a ZnSe compact which had been compression-formed by a rubber press into a rod-like shape having a diameter smaller than the inner diameter of the cylindrical portion. Further, ZnSe powder was filled in the spacing between the inner wall of the inner cylinder and the compact. The ZnSe powder used was produced by Rare Metallic Company (powder grade: 5N) and about 30 g were filled in total. The inner lid, which was also made of PBN, was fitted in the inner tube in which the starting material was enclosed. The thus-lidded inner cylinder was inserted in the intermediate high-purity quartz glass cylinder (product of Toshiba Ceramics Co., Ltd.; trade name: "T-1630S"). The intermediate high-purity quartz glass cylinder was then connected to a vacuum apparatus. After the interior was flushed twice with high-purity argon gas, the intermediate cylinder was sealed in a vacuum of about $10^{-5}$ Torr. The intermediate cylinder was placed in the outer molybdenum cylinder, followed by the insertion of the molybdenum spacer. The outer cylinder was then covered by the outer molybdenum lid, and the outer cylinder and outer lid were subjected to electron beam welding at a pressure of about $10^{-5}$ Torr. At that time, the crucible was cooled by a water-cooled copper block at all the portions except for the welded part, thereby preventing the intermediate quartz glass cylinder from being heated. The thus-assembled crucible was loaded in a Bridgman crystal growing apparatus of the vacuum furnace type. By setting the temperature of the hottest part of the furnace at 1,580° C., growth of a crystal was conducted at a crucible lowering rate of 2 mm/hr. After the crystal growing operation, the crucible was taken out from the furnace and an upper portion thereof was cut off on a lathe. It was observed that the intermediate quartz glass cylinder expanded and bonded like a lining on the inner wall of the outer molybdenum cylinder. The crystal thus obtained was a yellow and transparent single crystal. It was possible to easily separate the single crystal from the inner PBN cylinder. By ICP-AES (inductively coupled plasma-atomic emission) analysis, impurity levels of the starting ZnSe powder and a central part of the crystal were found as follows:

| Impurity | Concentration in starting material | Concentration in crystal |
|---|---|---|
| Mg | 1 ppm | 1 ppm |
| Si | 1 ppm | 2 ppm |
| Cu | 0.5 ppm | 1 ppm |
| Mo | Not detected | Not detected |

The increased impurity levels in the crystal appear to be attributable to impurities in the materials of the inner cylinder and intermediate cylinder and also to the vacuum apparatus.

EXAMPLE 2

A crystal growing operation wa conducted in exactly the same manner as in Example 1 except that BN powder was filled in a compacted state in the spacing between the intermediate cylinder and the outer cylinder and spacer. The BN powder (product of Wako Pure Chemical Industries, Ltd.; guaranteed grade) filled in the spacing had been baked in advance at 800° C. and $10^{-4}$ Torr for about 1 hour. When the crucible was cut off at an upper portion thereof after its removal from the furnace, it was observed that although the intermediate quartz glass cylinder was deformed, the possible melt adhesion between the intermediate cylinder and the outer molybdenum cylinder was successfully avoided and the loss of transparency was limited to some local areas.

The crystal thus obtained was a yellow and transparent single crystal. It was possible to easily separate the single crystal from the inner PBN cylinder. By ICP-AES analysis, impurity levels of the starting ZnSe powder and a central part of the crystal were found as follows:

| Impurity | Concentration in starting material | Concentration in crystal |
|---|---|---|
| Mg | 1 ppm | 1 ppm |
| Si | 1 ppm | 1.5 ppm |
| Cu | 0.5 ppm | 0.5 ppm |
| Mo | Not detected | Not detected |

The increased impurity level in the crystal appears to be attributable to impurities in the materials of the inner cylinder and intermediate cylinder and also to the vacuum apparatus.

EXAMPLE 3

Using a crucible of a similar structure to that employed in Example 1, growth of a crystal of CdSe (melting point: 1,252° C.; vapor pressure at the melting point: 15 atm) was conducted. The procedure of Example 1 was followed in exactly the same manner except that CdSe powder was filled as a packing material between the intermediate quartz cylinder and the outer molybdenum cylinder. The CdSe powder employed was produced by Rare Metallic Company (powder grade: 5N) and about 30 g were filled in total. CdSe was filled in a state as compact as possible between the intermediate cylinder and the outer cylinder with a view toward minimizing the difference between the melt level outside the intermediate cylinder and that inside the intermediate cylinder when CdSe was fused. Incidentally, it is not necessary for the thus-filled CdSe powder to have high purity. As an upper spacer, a sintered BN body which had been degasified in a vacuum furnace was used to prevent transfer of heat, which was produced upon electron beam welding of the outer lid, to the CdSe powder thus filled. The thus-assembled crucible was loaded in a Bridgman crystal growing apparatus of the vacuum furnace type. By setting the temperature of the hottest part of the furnace at 1,270° C., growth of a crystal was conducted at a crucible lowering rate of 2 mm/hr. After the crystal growing operation, the crucible was taken out from the furnace and an upper portion thereof was cut off on a lathe. It was observed that the hermetic enclosure by the intermediate quartz glass cylinder was still retained and the sagging of the intermediate quartz glass cylinder did not proceed to any troublesome degree.

This clearly demonstrates the usefulness of such a packing material upon crystallization at a temperature where quartz glass is still hard and is hence prone to breakage by internal pressure.

EXAMPLE 4

Figure 4:
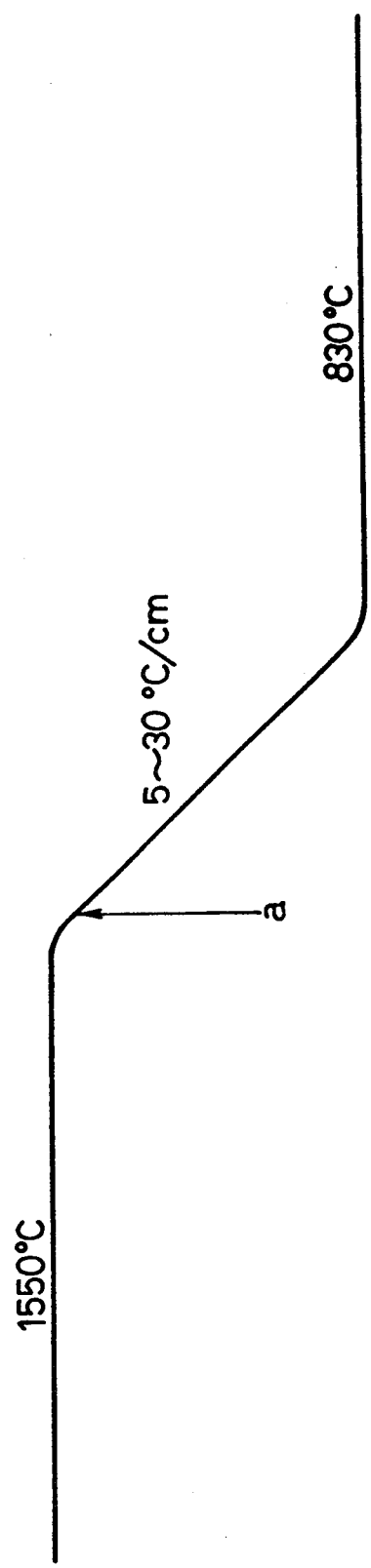
FIG. 4 is a diagram showing an exemplary temperature gradient curve of a vacuum Bridgman furnace in which the crucible of FIG. 3 is loaded.

Using a crucible of the structure shown in FIG. 3, growth of a single crystal of ZnSe (melting point: 1,520° C.) was conducted. The crucible was composed of an outer molybdenum cylinder, an intermediate high-purity quartz glass cylinder and an inner PBN cylinder. A seed crystal 9 was placed in a pointed end portion of the inner PBN cylinder. A lower portion of the intermediate quartz glass cylinder was formed as a small-diameter tube. Received on the bottom of the small-diameter tube was zinc of 99.9999% purity which was placed in a small PBN-made holder. The starting material was hermetically enclosed within the crucible in a similar manner to Example 1 except that ZnSe powder was filled between the intermediate cylinder and the outer cylinder to substantially equalize internal and external pressures to be exerted on the intermediate cylinder. The thus-assembled crucible was loaded in a vacuum Bridgman furnace which had the temperature gradient depicted in FIG. 4. The temperature was controlled in such a way that the position of the seed crystal was located at the point a, namely, at the melting point (1,520° C.) of ZnSe and the temperature of zinc positioned on the bottom of the intermediate quartz glass cylinder reached 830° C. It is the purpose of the above temperature control to precisely control the resulting ZnSe crystal to the stoichiometric composition by adjusting the vapor pressure of zinc at 346 mmHg in the intermediate cylinder. A crystal growing operation was conducted by setting the lowering rate of the crucible at 2 mm/hr and the rotating speed of the crucible at 10 rpm. In the above-described manner, it was possible to obtain a single crystal having the same crystal orientation as the seed crystal.

COMPARATIVE EXAMPLE

Figure 2:
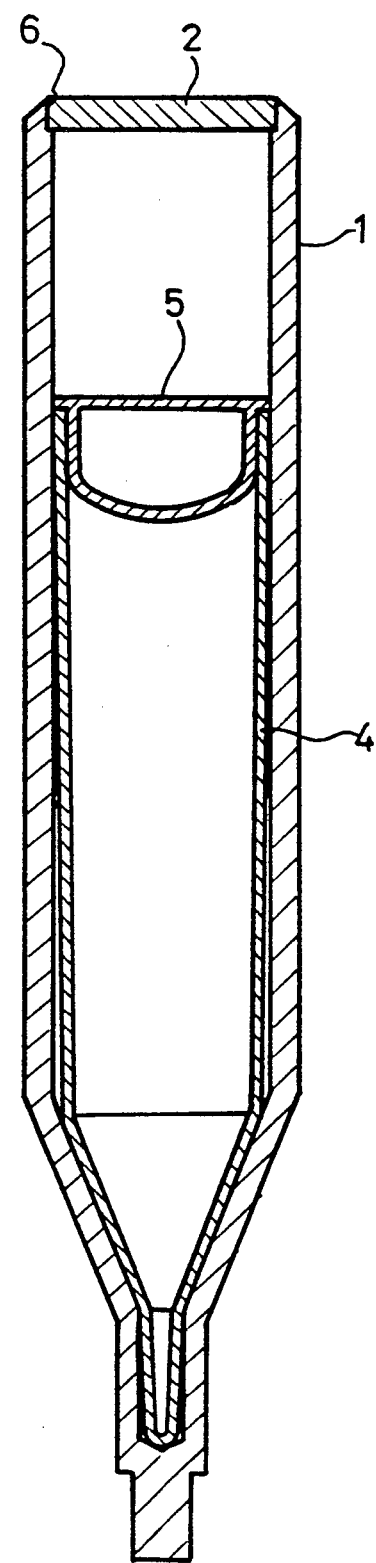
FIG. 2 is a longitudinal cross-section illustrating the structure of a conventional double-walled crucible.

Growth of a single crystal of ZnSe was conducted in a similar manner to Example 1 by using a crucible of the formula shown in FIG. 2. The outer and inner cylinders were made of molybdenum and PBN, and no intermediate quartz glass cylinder was used. The crystal thus obtained was a similar yellow and transparent single crystal to Example 1. By ICP-AES analysis, impurity levels of the starting ZnSe powder and a central part of the crystal were found as follows:

| Impurity | Concentration in starting material | Concentration in crystal |
|---|---|---|
| Mg | 1 ppm | 2 ppm |
| Si | 1 ppm | 2 ppm |
| Cu | 0.5 ppm | 3 ppm |
| Fe | Not detected | 5 ppm |
| Mo | Not detected | 2 ppm |

The increased impurity levels in the crystal were apparently attributable to the causes described in Examples 1 and 2 and also to impurities in the material of the outer cylinder.

INDUSTRIAL APPLICABILITY

According to the process of the invention, the growth of a crystal can be conducted in an environment which contains contaminants at extremely low levels. The process of the invention can produce crystals of an extremely high quality required for semiconductors and the like by a relatively simple apparatus and by a relatively easy operation. The process of the invention can therefore be used extremely advantageously.

I claim:

1. In a process for producing a single crystal from a melt of a starting material by solidification of the melt in a sealed quartz cylinder within a closed crucible to cause crystal growth as a single crystal, the improvement which comprises the steps of:
   (a) charging the starting material in to a receptacle which is adapted to hold the starting material and the melt and which is formed from at least one material selected from high melting ceramic materials and carbon materials;
   (b) inserting the receptacle with the starting material charged therein into a sealable quartz cylinder;
   (c) hermetically sealing the quartz cylinder to hermetically enclose therein the receptacle and its contents;
   (d) inserting the sealed quartz cylinder with the charged receptacle hermetically sealed therein into a crucible formed from a metal or alloy having a melting point of at least 1500° C.;
   (e) hermetically sealing the crucible to hermetically enclose therein the sealed quartz cylinder and its contents; and
   (f) heating the thus-assembled crucible to fuse the starting material, followed by crystal growth, whereby release of contaminants from the quartz cylinder into the melt during crystal growth is avoided and stable crystal growth with controlled crystal orientation is achieved.

2. The process of claim 1 which comprises the step of charging a powder of the same composition as the starting material in the space between the crucible and the quartz cylinder so that the vapor pressures within and outside the quartz cylinder remain equal as the crucible is heated.

3. The process of claim 1 which comprises forming a vacuum in the quartz cylinder prior to sealing the receptacle therein.

4. The process of claim 1 which comprises forming a vacuum in the crucible prior to sealing the quartz cylinder therein.

5. The process of claim 1, wherein the receptacle is formed of pyrolytic boron nitride.

6. The process of claim 1, wherein the receptacle is formed of graphite, pyrolytic graphite or vitreous carbon.

7. The process of claim 1 which comprises forming a vacuum in the quartz cylinder prior to sealing the inner cylinder therein; forming a vacuum in the crucible prior to sealing the quartz cylinder therein; and wherein the receptacle is formed of pyrolytic boron nitride or graphite.

8. The process of claim 7 which comprises the step of charging a powder of the same composition as the starting material in the space between the crucible and the quartz cylinder so that the vapor pressures within and outside the quartz cylinder remain equal as the crucible is heated.

9. The process of claim 1, wherein in step (f) the crucible is heated to the softening temperature of the quartz cylinder.

* * * * *